United States Patent
Koyanagi et al.

(10) Patent No.: US 7,576,016 B2
(45) Date of Patent: Aug. 18, 2009

(54) PROCESS FOR MANUFACTURING SEMICONDUCTOR DEVICE

(75) Inventors: Kenichi Koyanagi, Tokyo (JP); Takashi Arao, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 42 days.

(21) Appl. No.: 11/842,762

(22) Filed: Aug. 21, 2007

(65) Prior Publication Data

US 2008/0050884 A1 Feb. 28, 2008

(30) Foreign Application Priority Data

Aug. 23, 2006 (JP) .............................. 2006-225982

(51) Int. Cl.
*H01L 21/31* (2006.01)
*H01L 21/469* (2006.01)
*H01L 21/44* (2006.01)

(52) U.S. Cl. ...................... 438/785; 438/778; 438/762; 438/758; 438/680

(58) Field of Classification Search .................. 438/785
See application file for complete search history.

(56) References Cited

U.S. PATENT DOCUMENTS 6,821,563 B2 * 11/2004 Yudovsky ................ 427/248.1
2007/0269982 A1 * 11/2007 Rocklein et al. ............ 438/680

FOREIGN PATENT DOCUMENTS

| JP | 2000-54134 A | 2/2000 |
|---|---|---|
| JP | 2001-152339 A | 6/2001 |
| JP | 2003-031565 A | 1/2003 |
| JP | 2004-23043 A | 1/2004 |
| JP | 2004-281824 A | 10/2004 |
| JP | 2006-147896 A | 6/2006 |
| JP | 2006-161061 A | 6/2006 |
| JP | 2007-281407 A | 10/2007 |
| WO | 2005-088692 A1 | 9/2005 |

\* cited by examiner

*Primary Examiner*—Ha Tran T Nguyen
*Assistant Examiner*—Valerie Brown
(74) *Attorney, Agent, or Firm*—Sughrue Mion, PLLC

(57) ABSTRACT

An objective of this invention is to solve the problem that in ALD film deposition using a vertical batch processing machine advantageous for improving a throughput, reliability in a dielectric body formed on the bottom of a hole such as a capacitor formed on a semiconductor substrate is reduced as the hole is finer and deeper.

A dielectric body is formed by an ALD film deposition process comprising a gas flow sequence where a purging step after supplying a source and a reactant gases is a two-stage purging of vacuum purging and gas purging and the step of supplying a reactant gas is further divided. The process allows a highly reliable dielectric body to be formed in the bottom of a deep hole, contributing to improvement in reliability of a capacitor and a semiconductor device.

9 Claims, 12 Drawing Sheets

(a)

(b)

Voltage applied to the upper electrode (V)

(a)

(b)

PROCESS FOR MANUFACTURING SEMICONDUCTOR DEVICE

This application is based upon and claims the benefit of priority from Japanese patent application No. 2006-225982, filed on Aug. 23, 2006, the disclosure of which is incorporated herein in its entirety by reference.

BACKGROUND OF THE INVENTION

1. Field of the Invention

The present invention relates to a manufacturing process for a semiconductor device, particularly relates to a process for manufacturing a semiconductor device where by ALD (Atomic Layer Deposition), a film is formed on a semiconductor substrate comprising a plurality of deep holes on its surface.

2. Description of the Related Art

In manufacturing a semiconductor device, a film deposited by CVD (Chemical Vapor Deposition) is frequently used. CVD is a procedure where a source gas is reacted under certain temperature conditions in the gas phase and generating reactant molecules thus is deposited on a semiconductor substrate surface. However, as a size of a semiconductor device has been reduced, surface irregularity has become significant, and as a distance between concaves has been reduced, it has become more difficult to form a film with an even thickness precisely according to an irregular shape by the above CVD.

For overcoming the difficulty in the CVD, ALD has been recently used. ALD is a procedure where a source gas and a reactant gas are alternately supplied to deposit a film. First, during supplying a source gas, the supplied source gas is adsorbed to a semiconductor substrate surface. Then, source gas molecules are adsorbed to cover the surface of the semiconductor substrate, resulting in termination of the adsorption reaction. After purging the remaining source gas, during supplying a reactant gas as a next step, the oxidative or reducing reactant gas is contacted with the adsorbed source gas for initiating a reaction between them to form a desired film molecule. Subsequently, the step pursing the reactant gas and the step supplying the source gas again are alternately repeated to form a film by monomolecular layer until the resulting film has a desired thickness.

In contrast to CVD, a dominant deposition mechanism in the ALD is a surface adsorption reaction, so that a film with an even thickness can be formed even when the surface has an irregular shape. Japanese Laid-open Patent Publication No. 2000-54134 has disclosed ALD using a single-wafer processing machine. However, as described above, ALD is a process where deposition of a monomolecular layer is repeated, leading to extremely low productivity. Film deposition by ALD using a single-wafer processing machine is, therefore, unsuitable as a mass production technique for a semiconductor device.

For overcoming poor productivity with the above single-wafer processing machine, Japanese Laid-open Patent Publication No. 2004-23043 has described a process for forming a film by ALD using a vertical batch processing machine with a furnace body. This processing machine can improve significantly productivity because a film can be simultaneously formed on a plurality sheets of semiconductor substrate by ALD.

FIG. 1 shows an example of a vertical batch processing machine with a furnace body. A gas supply system in the vertical batch processing machine described in FIG. 1 in Japanese Laid-open Patent Publication No. 2004-23043 comprises a similar configuration to the above vertical batch processing machine.

In the vertical batch processing machine shown in FIG. 1, the top of a reaction tube 103a constituting a reaction chamber 103 comprises a vacuum exhaust outlet, which is connected to a vacuum valve 106 via a connection unit 105 and further connected to a vacuum pump 109 via a pressure-regulating valve 107 and a vacuum line 108. In the reaction chamber 103, a boat 101 is placed such that the boat 101 is supported by a boat loader 102 and is disposed a plurality of semiconductor substrates 100. Furthermore, a heater 104 for heating the semiconductor substrate surrounds the reaction tube 103a, in contact with its outer surface.

This vertical batch processing machine comprises a supply source for trimethylaluminum (TMA: $Al(CH_3)_3$) as a metal source gas, and the TMA supply source is connected to a gas injector 114 comprising a plurality of small holes via a TMA inlet valve 110, a liquid flow regulator (LMFC) 111, a vaporizer 112 and a valve 113. The plurality of small holes in the gas injector 114 are disposed, corresponding to the positions of the plurality of semiconductor substrates 100. To the vaporizer 112, a nitrogen ($N_2$) or argon (Ar) supply source is connected via a TMA carrier gas inlet valve 116 and a flow regulator (MFC) 115.

On the other hand, ozone ($O_3$) gas as one of reactant gases is generated by an $O_3$ generator (ozonizer) 118 using a gas fed from an oxygen ($O_2$) supply source via a flow regulator (MFC) 117 and then supplied to the reaction chamber from a gas injector 122 via an $O_3$ inlet valve 119. For purging the $O_3$ supply line, $N_2$ or Ar are supplied from an $N_2$ or Ar supply source via a flow regulator (MFC) 120 and a valve 121.

Steam ($H_2O$) to be the other reactant gas is connected to a gas injector 124 from an $H_2O$ supply source via a flow regulator (MFC) 122 and a valve 123. For purging a ($H_2O$) supply line, $N_2$, Ar or $O_2$ is supplied from an $N_2$, Ar or $O_2$ supply source via a flow regulator (MFC) 125 and a valve 126.

FIG. 2 shows a gas flow sequence when a tantalum oxide film is deposited by ALD as illustrated in FIG. 2 in Japanese Laid-open Patent Publication No. 2004-23043. A vertical batch processing machine similar to that described above is used, and pentaethoxytantalum (PET) is used as a metal source gas, $O_2$ is used as a reactant gas and $H_2O$ is used as a pre-treatment agent before supplying PET. In FIG. 2, the horizontal axis is an elapsed time and the vertical axis is a parallel flow sequence of gases fed from individual gas injectors. One cycle (120 sec) comprises supplying, first, $H_2O$ for 45 sec and purging the gas for 20 sec, next supplying PET for 20 sec and purging the gas for 10 sec, and finally supplying $O_2$ for 20 sec and purging the gas for 5 sec. In each gas purging, Ar fed from each gas injector is mainly used as a purge gas.

As described above, ALD deposition using the above vertical batch processing machine has an advantage that a production efficiency can be improved in comparison with a single-wafer processing machine. However, in a recent size-reduced semiconductor device, particularly a DRAM (Dynamic Random Access Memory), an aperture of a hole where a capacitor is to be formed has become narrower and deeper. Thus, when a film is deposited in such a deep hole, a problem of difficulty in forming an even film to the bottom of the deep hole using the gas flow sequence described in Japanese Laid-open Patent Publication No. 2004-23043 has become more prominent.

There will be described the above problem with reference to FIGS. 3 and 4. FIG. 3 is a cross-sectional view illustrating an example of a DRAM and FIG. 4 is an enlarged cross-sectional view of a capacitor.

First, a general configuration of a DRAM will be described with reference to the cross-sectional view shown in FIG. 3.

In a p-type silicon substrate 201, an n-type well 202 is formed and a first p-type well 203 is formed inside the n-type well 202. In the region other than the n-type well 202, there are formed a second p-type well 204 and an element-separating region 205. For descriptive purposes, the first p-type well 203 and the second p-type well 204 indicate a memory cell region comprising a plurality of memory cells and a peripheral circuit region, respectively.

In the first p-type well 203, there is formed a switching transistor 206 to be a word line in components in each memory cell. The switching transistor 206 comprises a drain 207, a source 208 and a gate electrode 210 via a gate insulating film 209. An interlayer insulating film 211 with a flat surface is formed such that it covers the gate electrode 210. On the source 208, a bit line 213 is formed via a bit-line contact plug 212. An interlayer insulating film 214 is formed such that it covers the bit line 213.

A capacitance-contact plug 215 is formed over a drain 207. A silicon nitride film 216 and an interlayer insulating film 217 are formed such that they covers the capacitance-contact plug 215. In given regions in the silicon nitride film 216 and the interlayer insulating film 217, holes 218 are formed for exposing the capacitance-contact plug 215. Furthermore, a lower electrode 219 of a capacitor is formed inside of the hole 218, and the lower electrode 219 of a capacitor is connected to the capacitance-contact plug 215. A dielectric body 220 and an upper electrode 221 is formed over the lower electrode 219 to provide a capacitor. An interlayer insulating film 222 is formed such that it covers the upper electrode 221. The upper electrode 221 is partly extended to a peripheral circuit region as a lead interconnection 223 and connected to an upper-layer interconnection 225 via a throughhole plug 224.

A transistor 206a comprises a drain 207, a source 208, a gate insulating film 209 and a gate electrode 210, and the transistor 206a is formed on a second p-type well 204 constituting a peripheral circuit. Interconnections 227 are formed via contact plugs 226 over the drain 207 and the source 208. A part of the interconnection 227 is connected to an upper-layer interconnection 225 via a throughhole plug 228. If necessary, a further upper interlayer insulating film and an interconnection are formed to provide a DRAM device.

FIG. 4 is an enlarged cross-sectional view of a capacitor. Here, an upper electrode is not shown. A lower electrode comprising HSGs (Hemispherical Silicon Grain) is formed inside of the hole 218 formed in the interlayer insulating film 217. Having HSGs, the lower electrode has a surface area about two times as large as that without HSGs, so that its capacitance can be approximately doubled. Although HSGs can be formed in a known manner, forming HSGs can considerably reduce a planar diameter of an in-hole space.

For example, it is assumed that a hole has a size of 3000 nm (depth) and 200 nm (the diameter indicated by D1 in the figure). After a silicon film with a thickness of 40 nm to be a matrix for HSGs is formed on the inside of the hole, HSGs are formed, so that a thickness of HSGs amounts to 80 nm. As a result, a planar diameter D2 of the remaining in-hole space is reduced to 40 nm. Considering that D2 can be 120 nm without HSGs, the remaining space has a significantly reduced diameter. For making a capacitor up, a dielectric body 220 must be formed within this narrow and deep space.

As described above, for a space in a narrow and deep hole, a gas flow sequence shown in FIG. 2 as described in Japanese Laid-open Patent Publication No. 2004-23043 has a problem of difficulty in forming a highly reliable capacity insulating film. In other words, the following steps were required for depositing a film on the bottom of a deep hole by ALD.

allowing a source gas involved in the deposition to reach the hole bottom;

purging for completely removing an excessive source gas not involved in adsorption from the hole bottom;

introducing a reactant gas to the hole bottom to react it with the adsorbed source gas completely;

purging for completely removing the reaction byproducts generated from the reaction and an excessive reactant gas from the hole bottom.

However, the gas flow sequence described in Japanese Laid-open Patent Publication No. 2004-23043 employs only gas purging with Ar, so that gas replacement between a gas to be supplied to a hole bottom and a gas to be removed from a hole bottom is inefficient. Thus, a capacity insulating film formed on the hole bottom does not have a stoichiometric composition, resulting in an insulating film with reduced insulation ability. A reduced insulation ability of a capacity insulating film leads to increase in a leak current and insufficient charge retention properties of a capacitor, due to which a highly reliable capacitor cannot be formed.

In view of these problems, an objective of the present invention is to provide a process for depositing ALD giving a highly reliable dielectric body even in a deep hole with a small diameter, for example, a hole comprising HSGs in its inside as well as to provide a highly reliable semiconductor device by the process.

SUMMARY OF THE INVENTION

After intense investigation, we have found that in depositing a metal oxide film by ALD, a gas flow sequence can be advantageously employed, where the purging step after the steps of supplying a source gas and of supplying a reactant gas is a two-stage process of vacuum purging and subsequent gas purging and the step of supplying a reactant gas is further divided. We have also found that combining these steps with ALD is effective for forming a highly reliable metal oxide film even in a deep hole, and have finally achieved a process for manufacturing a semiconductor device of this invention.

An exemplary aspect of the present invention, there is provided a process for manufacturing a semiconductor device where films are formed on a plurality of semiconductor substrates by ALD using a vertical batch processing machine, comprising at least depositing films on the plurality of semiconductor substrates by ALD by repeating twice or more a cycle of (1) a first step of supplying a source gas into a reaction chamber at a lower pressure than an atmospheric pressure in the vertical batch processing machine in which the plurality of semiconductor substrates are disposed, (2) a second step of vacuum-purging the reaction chamber, (3) a third step of gas-purging the reaction chamber, and (4) a fourth step of supplying a reactant gas into the reaction chamber, wherein the fourth step of supplying the reactant gas is divided into (4-1) a substep of supplying the reactant gas into the reaction chamber, (4-2) a substep of vacuum-purging the reaction chamber, and (4-3) a substep of gas-purging the reaction chamber, wherein a cycle of substeps (4-1) to (4-3) is repeated once or more.

An another exemplary aspect of the present invention, there is provided a process for manufacturing a semiconductor device where films are formed on a plurality of semiconductor substrates by ALD using a vertical batch processing machine, comprising at least (1) a first step of forming, in the plurality of semiconductor substrates comprising insulating films, a plurality of holes in the insulating films, (2) a second step of forming lower electrodes inside of the plurality of holes, (3) a third step of placing the plurality of semiconductor substrates with the lower electrodes within a reaction chamber of the vertical batch processing machine, (4) a fourth step of vacuuming the reaction chamber to a pressure lower than an atmospheric pressure and then supplying a metal source gas into the reaction chamber, (5) a fifth step of vacuum-purging the reaction chamber, (6) a sixth step of gas-purging the reaction chamber, (7) a seventh step of supplying an oxidizing gas into the reaction chamber, (8) an eighth step of repeating twice or more a cycle of the fourth to the seventh steps, to form dielectric bodies on the plurality of semiconductor substrates, (9) a ninth step of removing the plurality of semiconductor substrates from the reaction chamber, and

(10) a tenth step of forming upper electrodes on the dielectric bodies, wherein the seventh step of supplying the oxidizing gas is divided into (7-1) a substep of supplying the oxidizing gas into the reaction chamber, (7-2) a substep of vacuum-purging the reaction chamber, (7-3) a substep of gas-purging the reaction chamber, wherein a cycle of substeps (7-1) to (7-3) is repeated twice or more.

In a process for manufacturing a semiconductor device of this invention, the step of purging after the steps of supplying a source gas and of supplying a reactant gas is divided into two substeps of vacuum-purging and gas-purging. Thus, unreacted gases or reaction byproducts can be efficiently removed from the bottom of a deep hole. In addition, since gas purging is conducted after vacuum purging, a reactant gas can be supplied without fluctuation in a pressure in the reaction chamber.

In this invention, the step of supplying a reactant gas is divided into substeps, in each of which the above two-stage purging is conducted. Thus, in the bottom of a deep hole, a reactant gas can be sufficiently reacted with an adsorbed source gas. Therefore, even in the bottom of a deep hole, a dielectric body without impurities can be precisely formed to provide a highly reliable semiconductor device.

Furthermore, a film is formed for a plurality of semiconductor substrates using a vertical batch processing machine, so that a semiconductor device can be manufactured in a high productivity.

BRIEF DESCRIPTION OF THE DRAWINGS

FIG. 11(*b*) shows the measurement results of a leak current.

Figure 1:
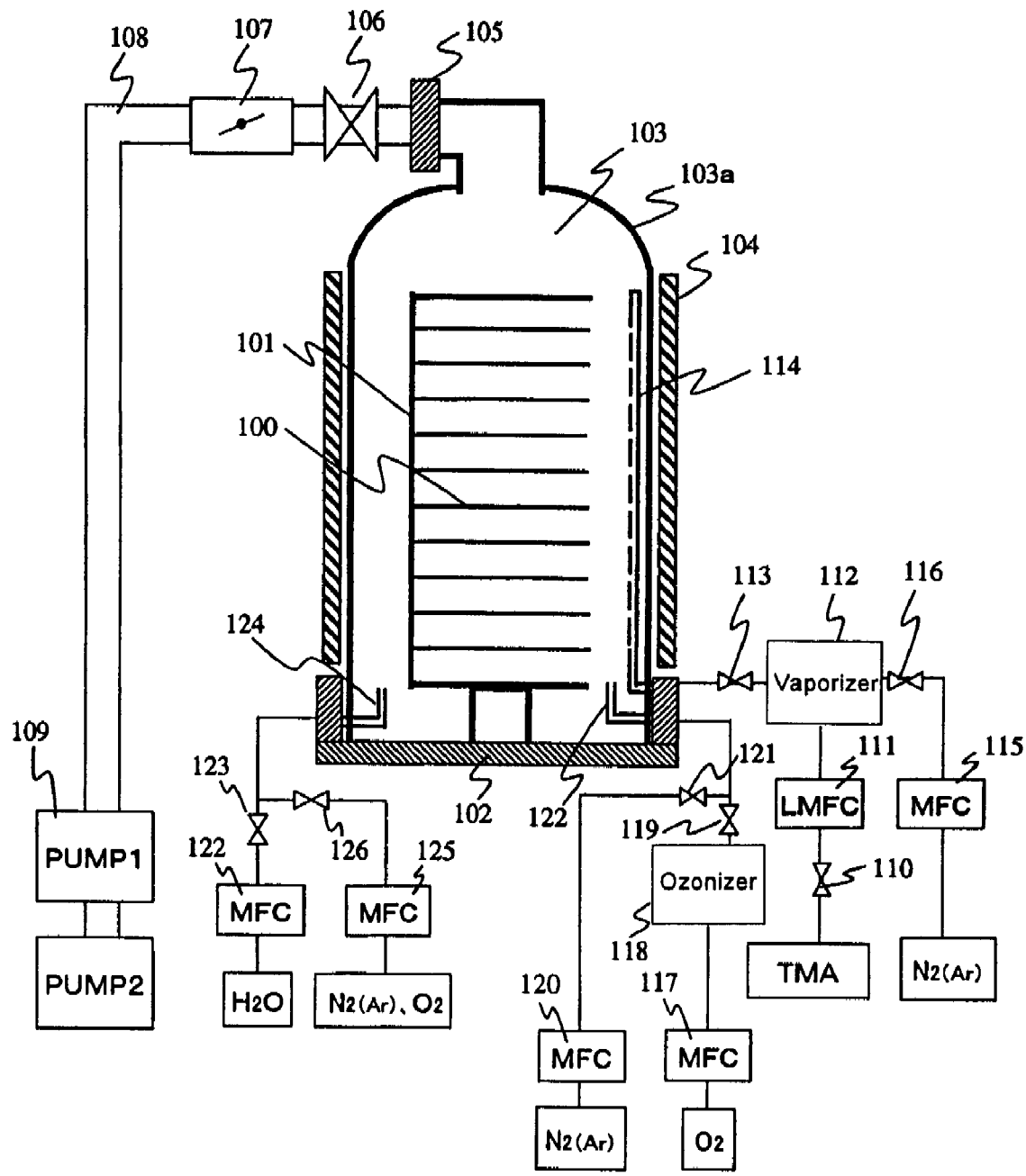
FIG. 1 is a schematic cross-sectional view generally illustrating a vertical batch processing machine for ALD film deposition.

The symbols in the drawings have the following meanings; 100: semiconductor substrate, 101: boat, 102: boat loader, 103: reaction chamber, 103*a*: reaction tube, 104: heater, 105: connecting part, 106: vacuum valve, 107: pressure-regulating valve, 108: vacuum line, 109: vacuum pump, 110: TMA inlet valve, 111: liquid flow regulator, 112: vaporizer, 113, 121, 123, 126: valve, 114, 122, 124: gas injector, 115, 117, 120, 122, 125: flow regulator, 116: carrier gas inlet valve, 118: ozonizer, 119: $O_3$ inlet valve, 200: HSG, 201: silicon substrate, 202: n-type well, 203: first p-type well, 204: second p-type well, 205: element-separating region, 206: switching transistor, 206*a*: transistor, 207: drain, 208: source, 209: gate insulating film, 210: gate electrode, 211, 214, 217, 222: interlayer insulating film, 212: bit line contact plug, 213: bit line, 215: capacitance-contact plug, 216: silicon nitride film, 218: hole, 219: lower electrode, 220: dielectric body, 221: upper electrode, 223: lead interconnection, 224, 228: throughhole plug, 225: upper-layer interconnection, 226: contact plug and 227: interconnection.

DETAILED DESCRIPTION OF PREFERRED EMBODIMENTS

First Process for Manufacturing a Semiconductor Device

This process is a process for manufacturing a semiconductor device where films are formed on a plurality of semiconductor substrates by ALD using a vertical batch processing machine, comprising at least depositing films on the plurality of semiconductor substrates by ALD by repeating twice or more a cycle of (1) a first step of supplying a source gas into a reaction chamber at a lower pressure than an atmospheric pressure in the vertical batch processing machine in which the plurality of semiconductor substrates are disposed, (2) a second step of vacuum-purging the reaction chamber, (3) a third step of gas-purging the reaction chamber, and (4) a fourth step of supplying a reactant gas into the reaction chamber, wherein the fourth step of supplying the reactant gas is divided into (4-1) a substep of supplying the reactant gas into the reaction chamber, (4-2) a substep of vacuum-purging the reaction chamber, and (4-3) a substep of gas-purging the reaction chamber, wherein a cycle of substeps (4-1) to (4-3) is repeated once or more.

The above process for manufacturing a semiconductor device contains multiple cycles comprising substeps (4-1) to (4-3) (hereinafter, this multiple-cycle process is referred to as "multi-cycle 1") and steps (1) to (4) (hereinafter, this multiple-cycle process is referred to as "multi-cycle 2"). Therefore, the total cycle number of substeps (4-1) to (4-3) is expressed as (the cycle number of multi-cycle 1)×(the cycle number of multi-cycle 2).

According to the manufacturing process of this invention, a uniform film can be formed by ALD when a plurality of holes are formed in the surface of a semiconductor substrate to a depth of 2,000 to 3,500 nm.

It is preferable to add, after step (4), (5) a fifth step of vacuum-purging the reaction chamber, and (6) a sixth step of gas-purging the reaction chamber.

When repeating the multi-cycles, the additional steps (5) and (6) ensure removal of a reactant gas to effectively prevent it from reacting with a source gas such as TMA supplied in a subsequent cycle in the gas phase.

Second Process for Manufacturing a Semiconductor Device

This process is a process for manufacturing a semiconductor device where films are formed on a plurality of semiconductor substrates by ALD using a vertical batch processing machine, comprising at least (1) a first step of forming, in the plurality of semiconductor substrates comprising insulating films, a plurality of holes in the insulating films, (2) a second step of forming lower electrodes inside of the plurality of holes, (3) a third step of placing the plurality of semiconductor substrates with the lower electrodes within a reaction chamber of the vertical batch processing machine, (4) a fourth step of vacuuming the reaction chamber to a pressure lower than an atmospheric pressure and then supplying a metal source gas into the reaction chamber, (5) a fifth step of vacuum-purging the reaction chamber, (6) a sixth step of gas-purging the reaction chamber, (7) a seventh step of supplying an oxidizing gas into the reaction chamber, (8) an eighth step of repeating twice or more a cycle of the fourth to the seventh steps, to form dielectric bodies on the plurality of semiconductor substrates, (9) a ninth step of removing the plurality of semiconductor substrates from the reaction chamber, and

(10) a tenth step of forming upper electrodes on the dielectric bodies, wherein the seventh step of supplying the oxidizing gas is divided into (7-1) a substep of supplying the oxidizing gas into the reaction chamber, (7-2) a substep of vacuum-purging the reaction chamber, (7-3) a substep of gas-purging the reaction chamber, wherein a cycle of substeps (7-1) to (7-3) is repeated twice or more.

The above process for manufacturing a semiconductor device contains multiple cycles comprising substeps (7-1) to (7-3) (hereinafter, this multiple-cycle process is referred to as "multi-cycle 3") and steps (4) to (7) (hereinafter, this multiple-cycle process is referred to as "multi-cycle 4"). Therefore, the total cycle number of substeps (7-1) to (7-3) is expressed as (the cycle number of multi-cycle 3)×(the cycle number of multi-cycle 4).

According to the manufacturing process of this invention, a uniform film can be formed by ALD when a depth of the holes formed in the first step is 2,000 to 3,500 nm.

In the first and the second processes for manufacturing a semiconductor device, the term "vertical batch processing machine" refers to a highly productive processing machine in which a plurality of semiconductor substrates can be vertically loaded and can process multiple substrates at one time.

Preferably, a source gas contains at least one metal selected from the group consisting of aluminum (Al), hafnium (Hf), tantalum (Ta), zirconium (Zr), strontium (Sr) and titanium (Ti), and an oxidizing gas contains at least one of ozone ($O_3$) and steam ($H_2O$). By using such source and oxidizing gases, a uniform film can be effectively formed by ALD.

The dielectric body formed in the step (8) is preferably a multilayer film of single metal-oxide films or of different metal-oxide films.

Preferably, between steps (7) and (9),

(11) an eleventh step of vacuum-purging the reaction chamber and

(12) a twelfth step of gas-purging the reaction chamber and the eighth step in the step (8) is a step of forming dielectric bodies on the plurality of semiconductor substrates by repeating twice or more a cycle of the fourth to the seventh steps and the eleventh to the twelfth steps. When repeating the multi-cycles, steps (11) and (12) ensure removal of a reactant gas to effectively prevent it from reacting with a source gas such as TMA supplied in a subsequent cycle in the gas phase.

There will be detailed some embodiments of this invention with reference to the drawings. In the following description, the vertical batch processing machine shown in FIG. 1 is used.

EXAMPLES

Reference Example 1

In Reference Example 1, there will be described a basic gas flow sequence for forming an aluminum oxide film using TMA as a metal source gas and oxidizing $O_3$ as a reactant gas with reference to FIG. 5.

As shown in FIG. 1, semiconductor substrates 100 (50 sheets) with a diameter of 300 mm were placed in a reaction chamber 103, and $N_2$ was introduced from each gas injector into the reaction chamber and while keeping a pressure at 80 Pa (0.6 Torr), a temperature of the semiconductor substrates 100 was stabilized. After stabilizing the semiconductor substrate 100 at 300° C., an aluminum oxide film was deposited in accordance with the gas flow sequence shown in FIG. 5.

Figure 5:
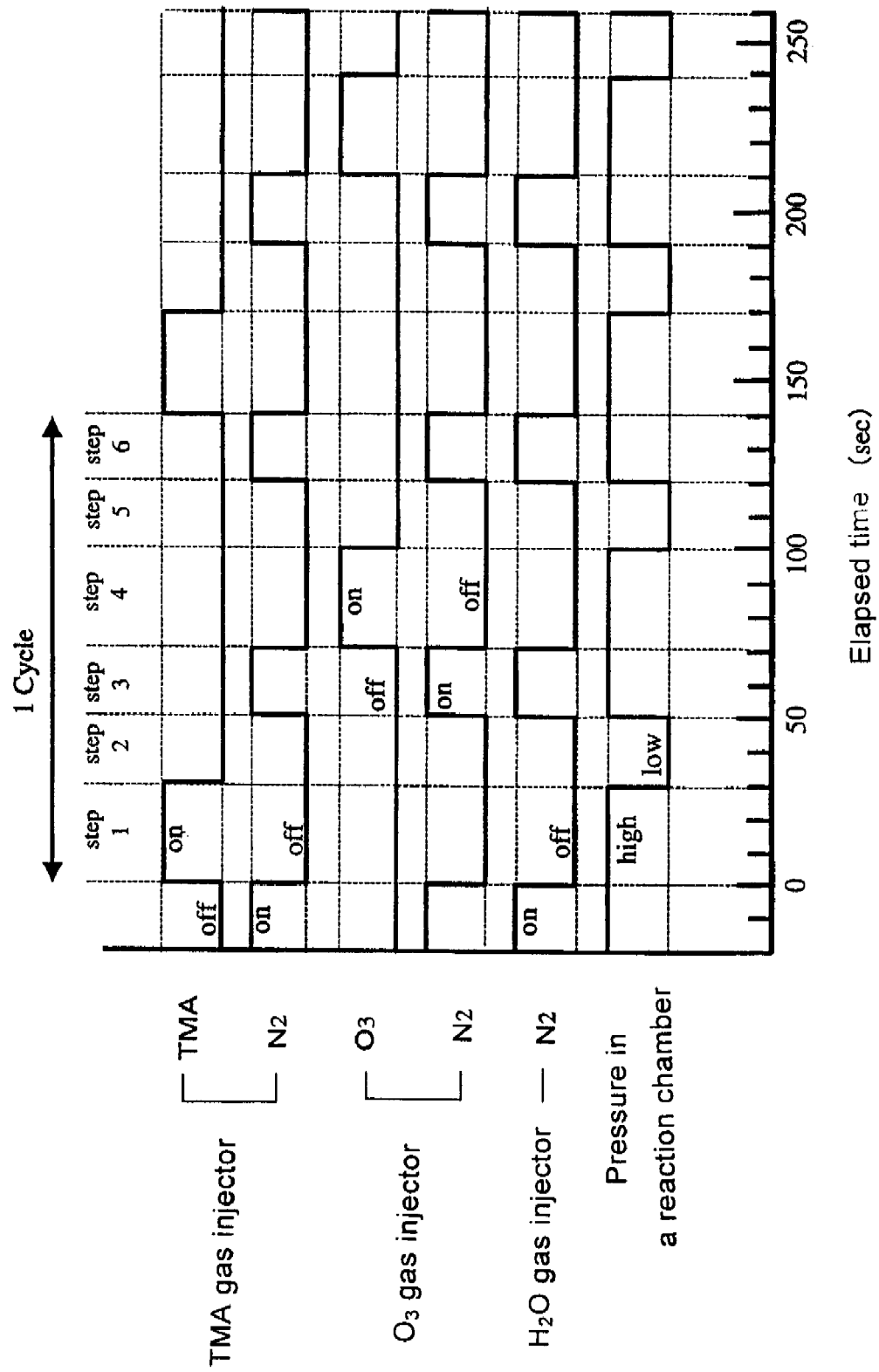
FIG. 5 shows an ALD gas flow sequence illustrating Reference Example 1 of the present invention.

(1) First, on stopping $N_2$ supply from each gas injector, TMA was supplied for 30 sec from a TMA gas injector while keeping a pressure at 80 Pa (FIG. 5, Step 1).

(2) Next, on stopping TMA supply, the pressure-regulating valve 107 shown in FIG. 1 was fully opened and the reaction chamber was vacuum-purged for 20 sec (FIG. 5, Step 2). Here, a pressure was 5 Pa (0.04 Torr).

(3) Then, $N_2$ was supplied from each gas injector to gas-purge the chamber for 20 sec while keeping a pressure at 200 Pa (1.5 Torr) by the pressure-regulating valve 107 (FIG. 5, Step 3).

(4) Next, on stopping $N_2$ supply from each gas injector, $O_3$ was supplied for 30 sec from an $O_3$ gas injector while keeping a pressure at 200 Pa (FIG. 5, Step 4).

(5) Subsequently, on stopping $O_3$ supply, the pressure-regulating valve 107 was fully opened and the reaction chamber was vacuum-purged for 20 sec (FIG. 5, Step 5).

(6) Then, $N_2$ was supplied from each gas injector to gas-purge the chamber for 20 sec while keeping a pressure at 80 Pa by the pressure-regulating valve 107 (FIG. 5, Step 6).

A cycle from the above steps (1) to (6) was repeated 50 times to deposit an aluminum oxide film with a thickness of 4 nm. A basic mechanism for forming aluminum oxide by ALD is as follows. First, TMA ($Al(CH_3)_3$) to be introduced is adsorbed to a semiconductor substrate surface such that one layer is formed, and the excessive TMA in the reaction chamber is purged. Then, $O_3$ is supplied to react with $Al(CH_3)_3$ adsorbed to the surface to generate solid aluminum oxide and volatile $CO_2$ and $H_2O$. In a next step, volatile $CO_2$ and $H_2O$ and excessive $O_3$ are purged to provide an aluminum oxide film on the substrate surface.

Example 1

Example 1 will be described with reference to FIG. 6. Example 1 is different from Reference Example 1 in that the step of supplying $O_3$ is divided into two substeps. Otherwise, Example 1 is as described in Reference Example 1, and its description is not, therefore, repeated.

Figure 6:
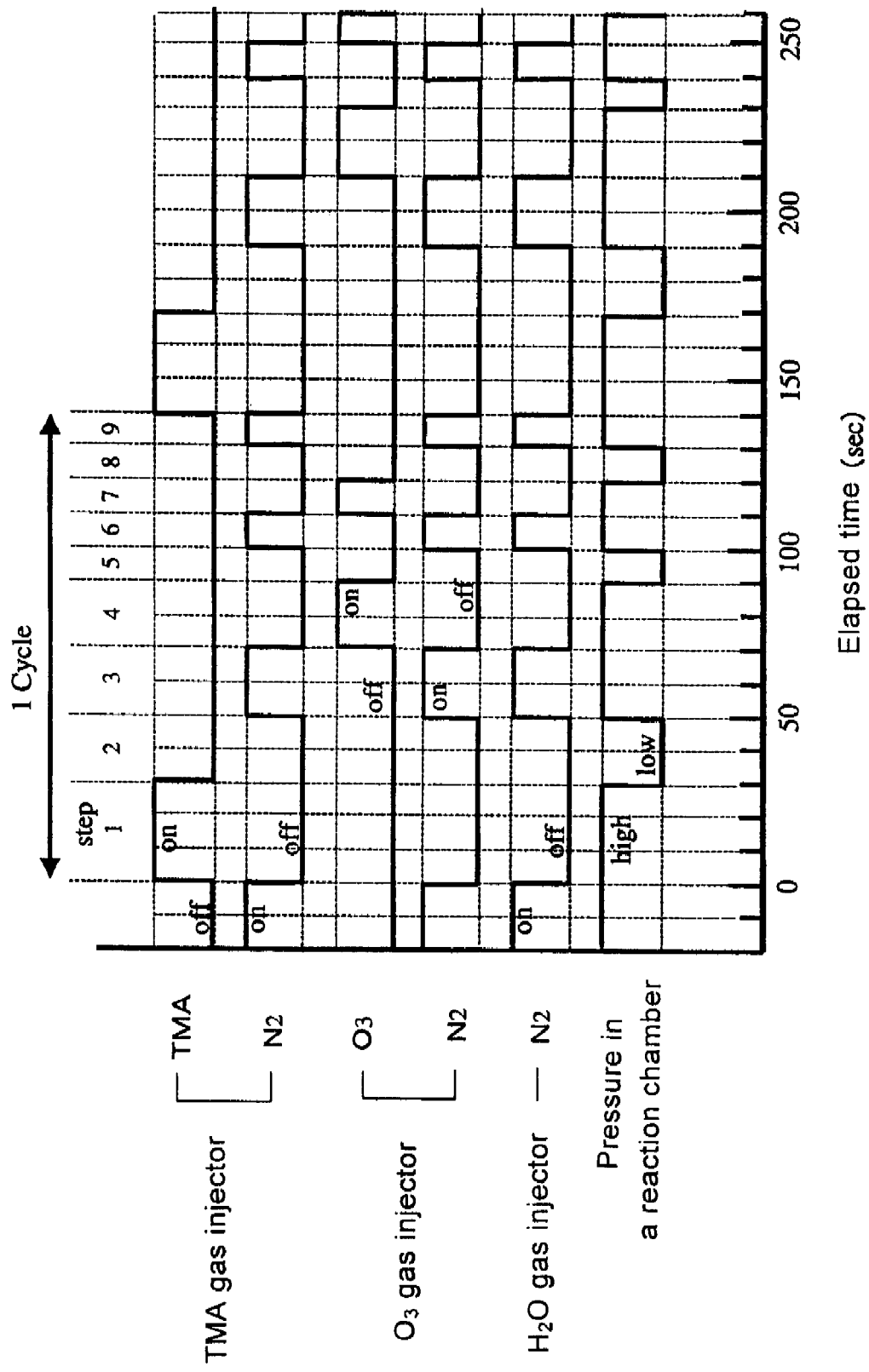
FIG. 6 shows an ALD gas flow sequence illustrating Example 1 of the present invention.

(1) First, as described in Reference Example 1, on stopping $N_2$ supply from each gas injector, TMA was supplied for 30 sec from a TMA gas injector while keeping a pressure at 80 Pa (FIG. 6, Step 1; the first step).

(2) Next, as described in Reference Example 1, on stopping TMA supply, the reaction chamber was vacuum-purged for 20 sec (FIG. 6, Step 2; the second step).

(3) Then, as described in Reference Example 1, $N_2$ was supplied from each gas injector and the chamber was gas-purged for 20 sec while keeping a pressure at 200 Pa (FIG. 6, Step 3; the third step).

(4) Then, on stopping $N_2$ supply from each gas injector, $O_3$ was supplied for 20 sec from an $O_3$ gas injector while keeping a pressure at 200 Pa (FIG. 6, Step 4; substep (4-1)).

(5) Next, on stopping $O_3$ supply, the reaction chamber was vacuum-purged for 10 sec (FIG. 6, Step 5; substep (4-2)).

(6) Subsequently, $N_2$ was supplied from each gas injector and the chamber was gas-purged for 10 sec while keeping a pressure at 200 Pa (FIG. 6, Step 6; substep (4-3)).

(7) Then, on stopping $N_2$ supply from each gas injector, $O_3$ was supplied for 10 sec from an $O_3$ gas injector while keeping a pressure at 200 Pa (FIG. 6, Step 7; substep (4-1)).

(8) Next, on stopping $O_3$ supply, the reaction chamber was vacuum-purged for 10 sec (FIG. 6, Step 8; substep (4-2)).

(9) Then, $N_2$ was supplied from each gas injector and the chamber was gas-purged for 10 sec while keeping a pressure at 80 Pa (FIG. 6, Step 9; substep (4-3)).

A cycle comprising the above steps (1) to (9) was repeated 50 times to deposit an aluminum oxide film with a thickness of 4 nm. Example 1 employs two-stage purging of vacuum purging and gas purging, and furthermore, the step of supplying $O_3$ used as a reactant gas which is divided into two substep groups of steps 4 to 6 and steps 7 to 9, so that a gas in a deep hole can be further efficiently replaced.

Example 2

Example 2 will be described with reference to FIG. 7. Example 2 is different from Reference Example 1 in that the step of supplying $O_3$ is divided into three substeps. Otherwise, Example 2 is as described in Reference Example 1, and its description is not, therefore, repeated.

Figure 7:
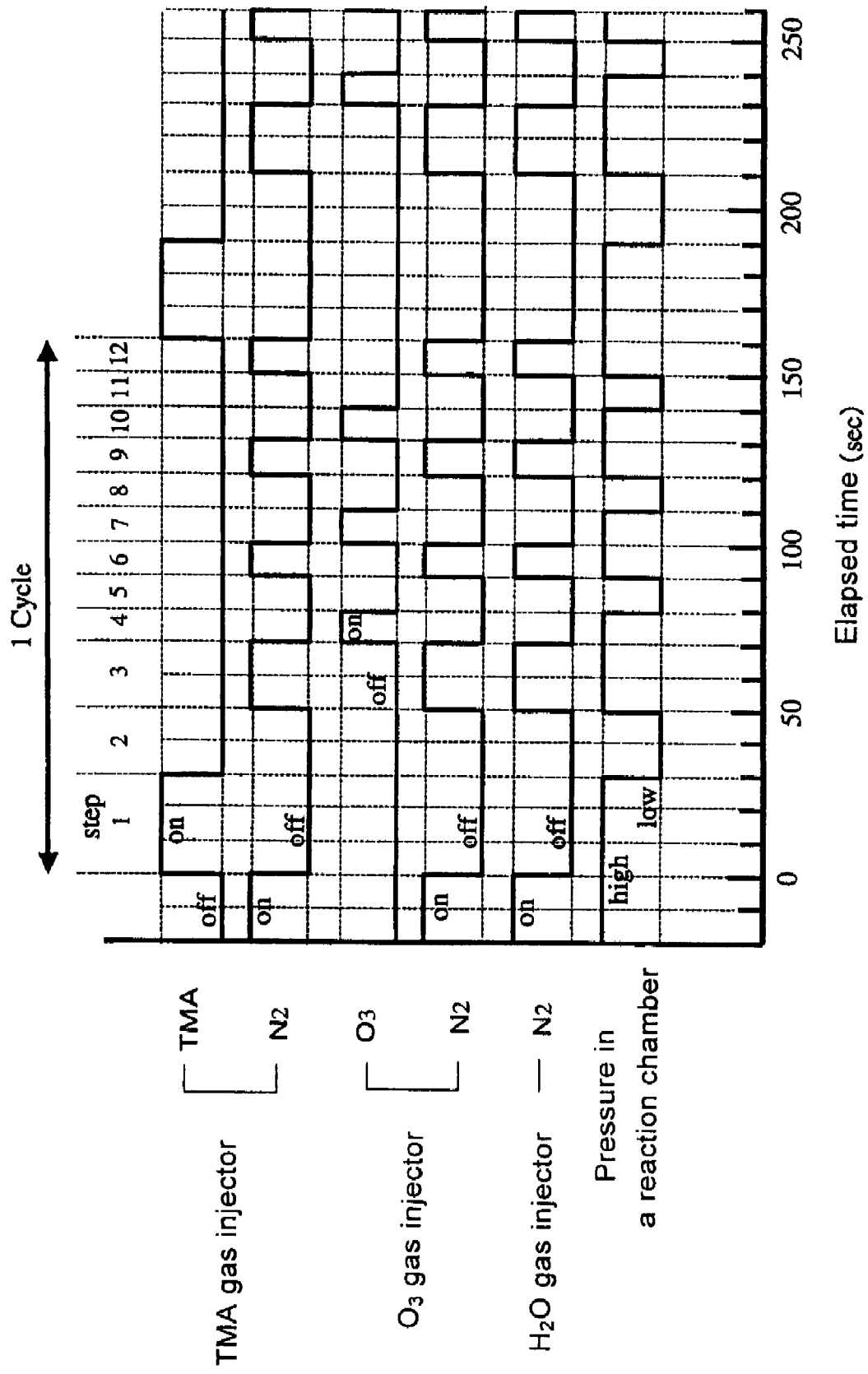
FIG. 7 shows an ALD gas flow sequence illustrating Example 2 of the present invention.

(1) First, as described in Reference Example 1, on stopping $N_2$ supply from each gas injector, TMA was supplied for 30 sec from a TMA gas injector while keeping a pressure at 80 Pa (FIG. 7, Step 1; the first step).

(2) Next, as described in Reference Example 1, on stopping TMA supply, the reaction chamber was vacuum-purged for 20 sec (FIG. 7, Step 2; the second step).

(3) Then, as described in Reference Example 1, $N_2$ was supplied from each gas injector and the chamber was gas-purged for 20 sec while keeping a pressure at 200 Pa (FIG. 7, Step 3; the third step).

(4) Then, on stopping $N_2$ supply from each gas injector, $O_3$ was supplied for 10 sec from an $O_3$ gas injector while keeping a pressure at 200 Pa (FIG. 7, Step 4; substep (4-1)).

(5) Next, on stopping $O_3$ supply, the reaction chamber was vacuum-purged for 10 sec (FIG. 7, Step 5; substep (4-2)).

(6) Subsequently, $N_2$ was supplied from each gas injector and the chamber was gas-purged for 10 sec while keeping a pressure at 200 Pa (FIG. 7, Step 6; substep (4-3)).

(7) Then, on stopping $N_2$ supply from each gas injector, $O_3$ was supplied for 10 sec from an $O_3$ gas injector while keeping a pressure at 200 Pa (FIG. 7, Step 7; substep (4-1)).

(8) Next, on stopping $O_3$ supply, the reaction chamber was vacuum-purged for 10 sec (FIG. 7, Step 8; substep (4-2)).

(9) Then, $N_2$ was supplied from each gas injector and the chamber was gas-purged for 10 sec while keeping a pressure at 200 Pa (FIG. 7, Step 9; substep (4-3)).

(10) Then, on stopping $N_2$ supply from each gas injector, $O_3$ was supplied for 10 sec from an $O_3$ gas injector while keeping a pressure at 200 Pa (FIG. 7, Step 10; substep (4-1)).

(11) Next, on stopping $O_3$ supply, the reaction chamber was vacuum-purged for 10 sec (FIG. 7, Step 11; substep (4-2)).

(12) Then, $N_2$ was supplied from each gas injector and the chamber was gas-purged for 10 sec while keeping a pressure at 80 Pa (FIG. 7, Step 12; substep (4-3)).

A cycle comprising the above steps (1) to (12) was repeated 50 times to deposit an aluminum oxide film with a thickness of 4 nm. Example 2 employs two-stage purging of vacuum purging and gas purging, and furthermore, the step of supplying $O_3$ used as a reactant gas which is divided into three substep groups of steps 4 to 6, steps 7 to 9 and steps 10 to 12, so that a gas in a deep hole can be further efficiently replaced. Alternatively, the step of supplying $O_3$ may be constituted by a plurality of cycles of 4 or more steps.

Example 3

Example 3 will be described with reference to FIG. 8. Example 3 is different from Example 2 in that the purging step after supplying TMA is divided into two substeps.

Figure 8:
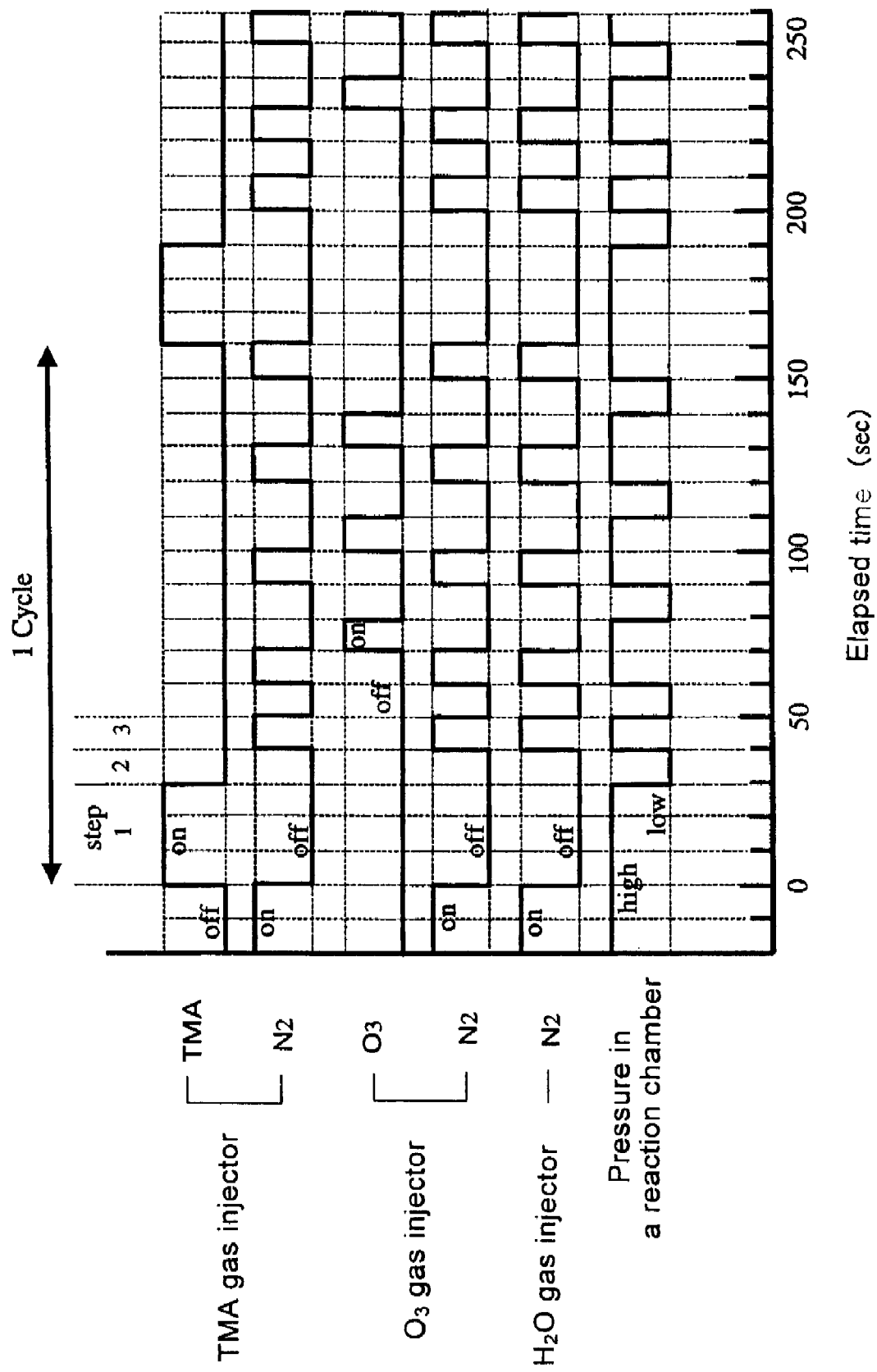
FIG. 8 shows an ALD gas flow sequence illustrating Example 3 of the present invention.

(1) First, as described in Example 2, on stopping $N_2$ supply from each gas injector, TMA was supplied for 30 sec from a TMA gas injector while keeping a pressure at 80 Pa (FIG. 8, Step 1; the first step).

(2) Next, on stopping TMA supply, the reaction chamber was vacuum-purged for 10 sec (FIG. 8, Step 2; the second step).

(3) Then, $N_2$ was supplied from each gas injector and the chamber was gas-purged for 10 sec while keeping a pressure at 200 Pa (FIG. 8, Step 3; the third step).

The above purging steps (2) and (3) are repeated twice to purge TMA. Thus, TMA can be more efficiently purged, so that a highly insulative aluminum oxide film may be probably deposited.

The steps after the above step (3) are as described for steps (4) to (12) in Example 2.

Example 4

There will be described a gas flow sequence when depositing a laminate of aluminum oxide and hafnium oxide in Example 4 with reference to FIG. 9. Hafnium oxide can be deposited basically by the gas flow sequence used for deposition of an aluminum oxide film described in Examples 1 to 3. However, Example 4 is different from any of Examples 1 to 3 in that a hafnium-material supply system is, in addition to a TMA supply system, separately provided in the vertical batch processing machine illustrated in FIG. 1. The hafnium material may be, for example, tetraethylmethylamide hafnium (TEMAH: $Hf(N(CH_3)(C_2H_5))_4$), and a gas supply system may be configured as described for TMA.

Figure 9:
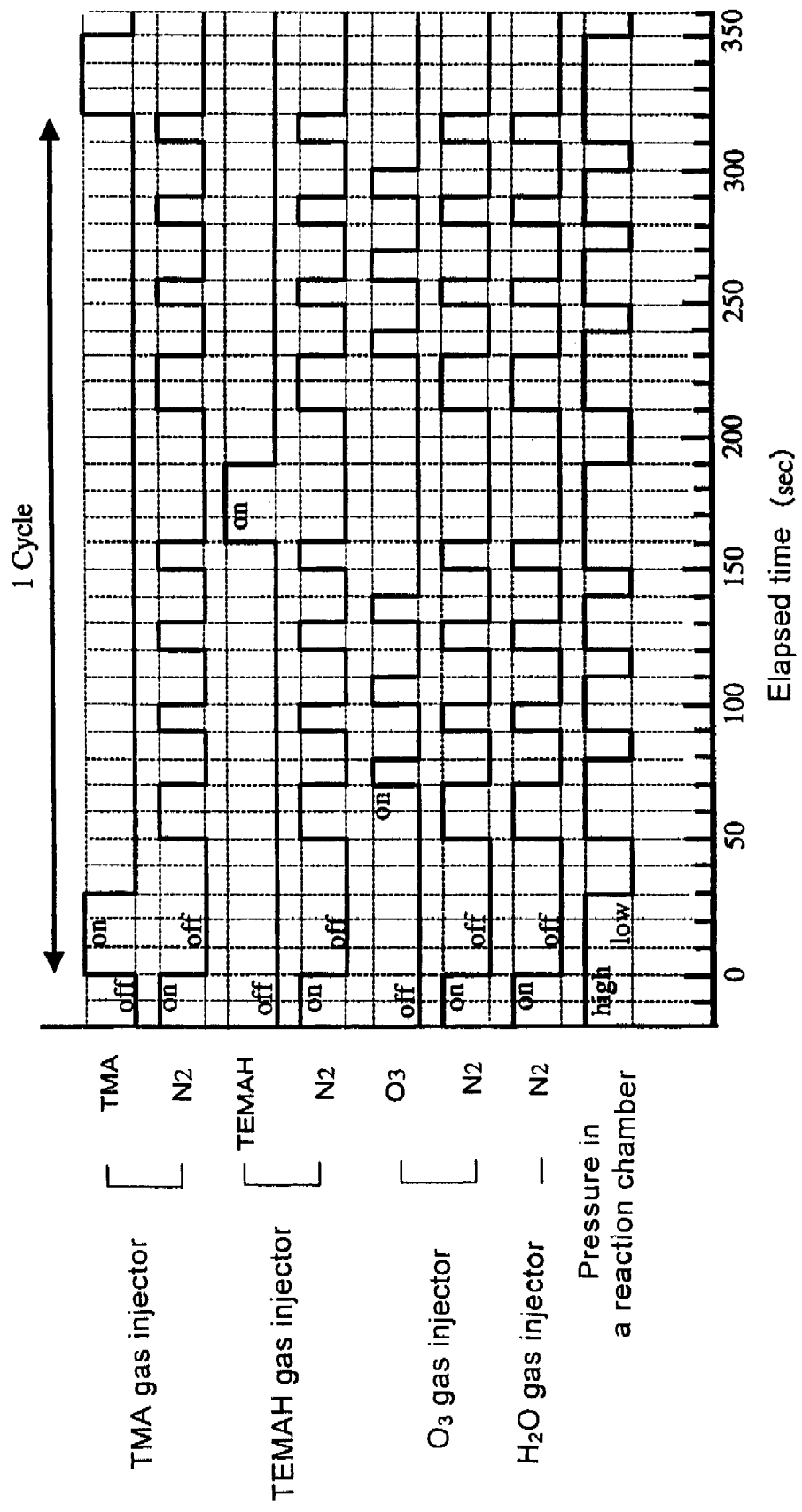
FIG. 9 shows an ALD gas flow sequence illustrating Example 4 of the present invention.

In the gas flow sequence shown in FIG. 9, first, aluminum oxide was deposited using a deposition gas flow sequence in Example 1 for an aluminum oxide film, and then the same gas flow sequence was employed to deposit hafnium oxide. In other words, in this film depositing method, first, steps (1) to (9) are conducted to deposit aluminum oxide and then, steps (1) to (9) are again conducted to deposit hafnium oxide. In this deposition of hafnium oxide, again, the purging step after supplying a source gas and a reactant gas is a two-stage purging of vacuum purging and gas purging, and the step of supplying a reactant gas is further divided. Thus, as is in an aluminum oxide film, a highly insulative film can be formed even on the bottom of a deep hole.

A relative dielectric constant of hafnium oxide thus formed is about 20, which is about 2.2 times as large as that of aluminum oxide, so that a dielectric constant as a dielectric body formed can be improved, resulting in increase in a capacitance of a capacitor.

Comparative Example 1

Figure 2:
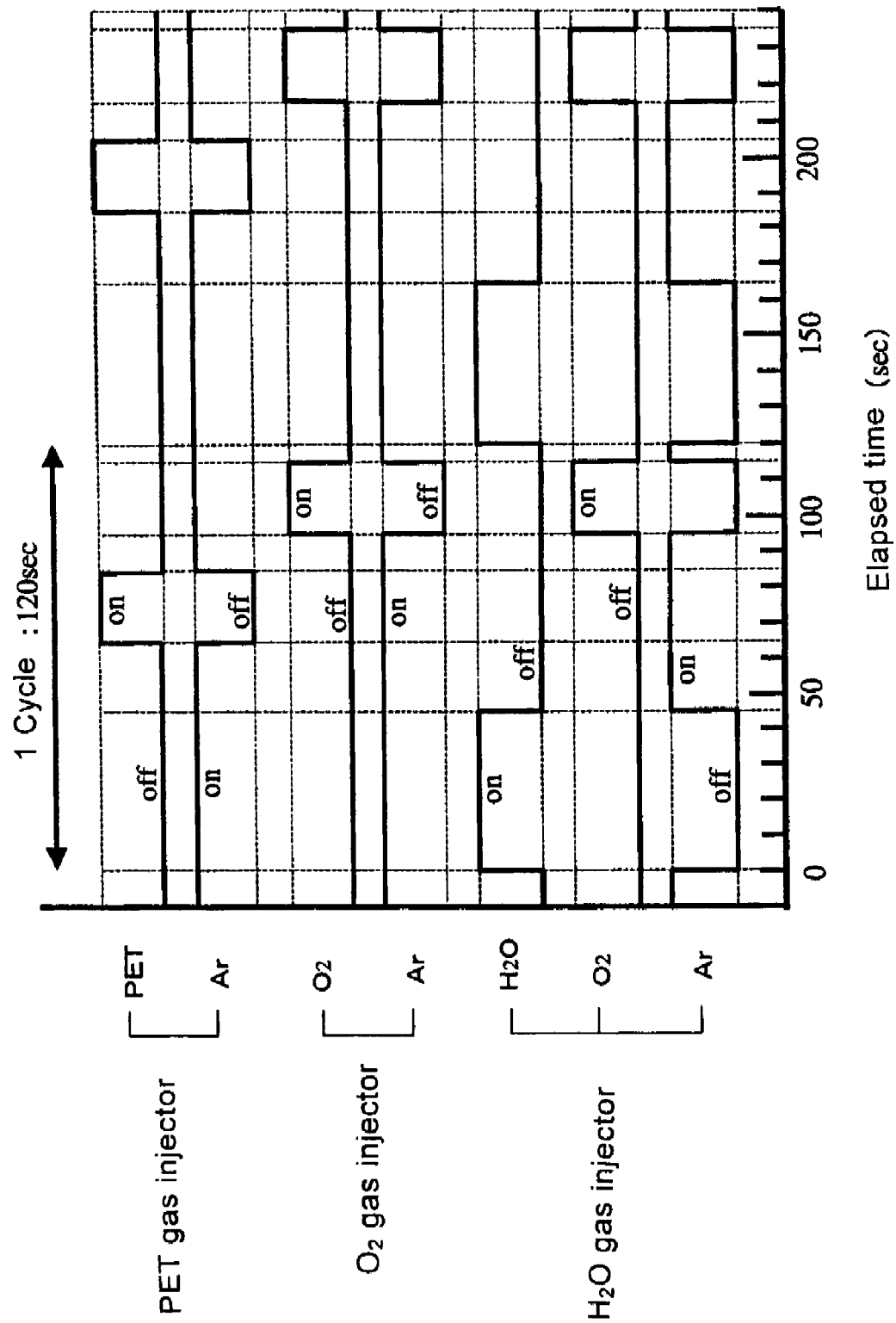
FIG. 2 shows a related ALD gas flow sequence described in Japanese Laid-open Patent Publication No. 2004-23043.
Figure 3:
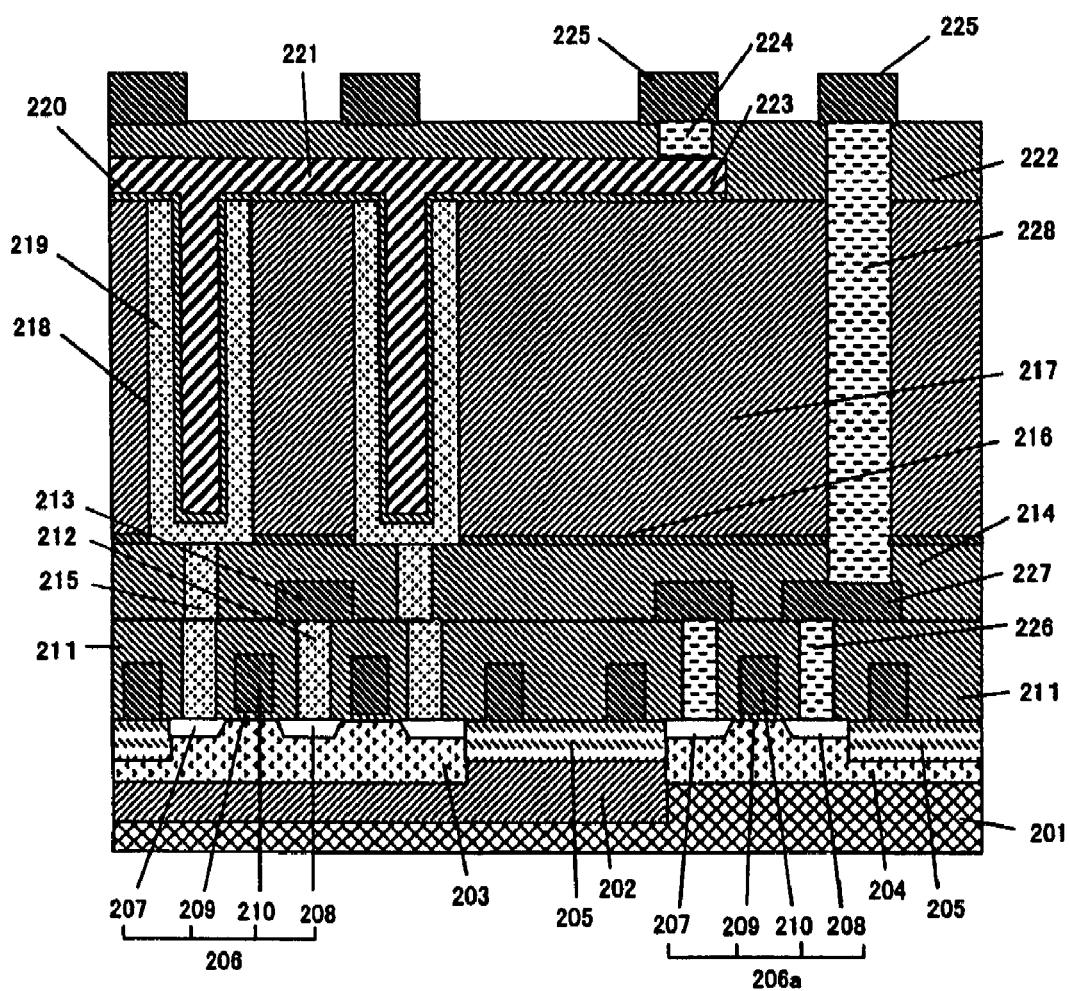
FIG. 3 is a schematic cross-sectional view illustrating a structure of a DRAM.
Figure 10:
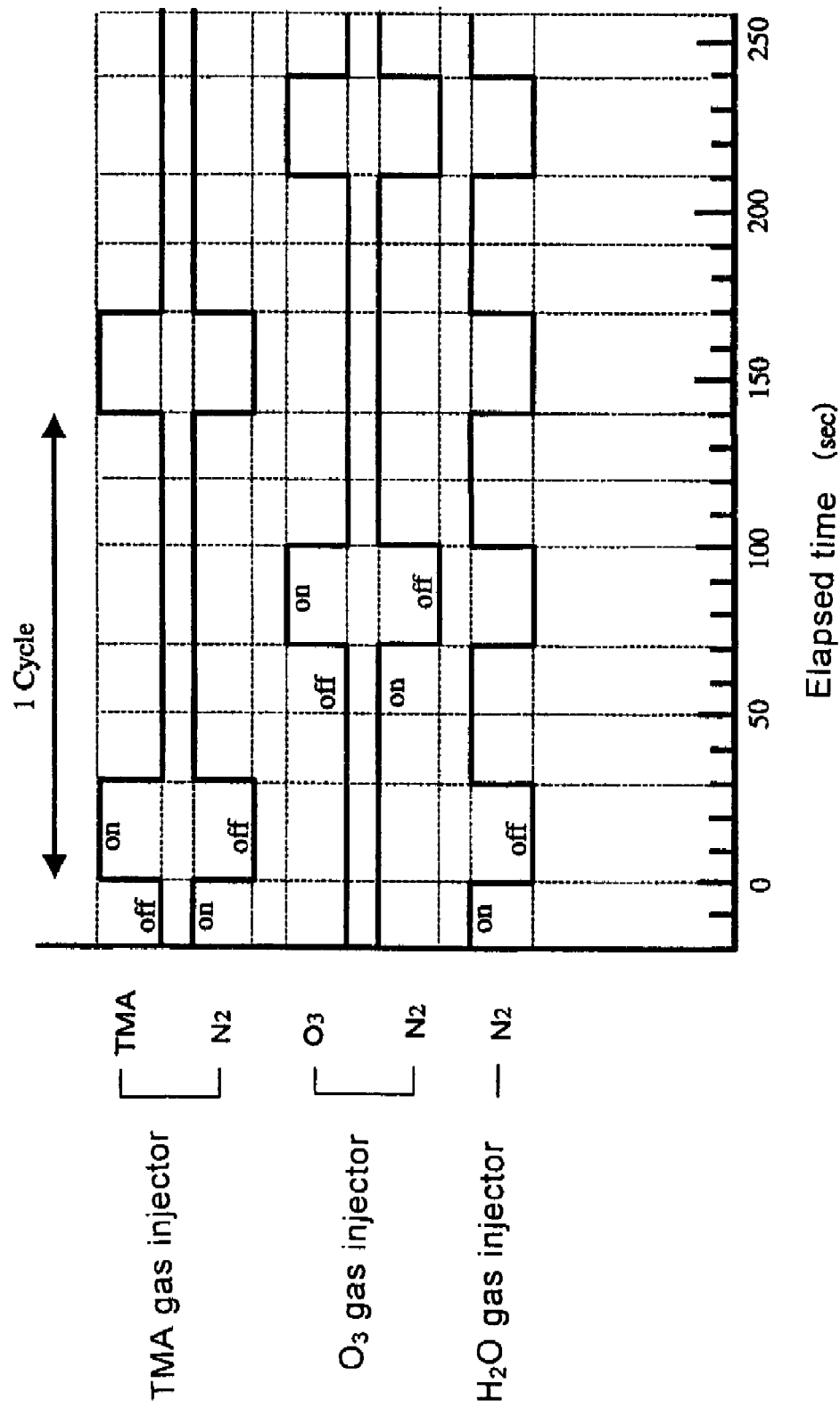
FIG. 10 shows an ALD gas flow sequence illustrating Comparative Example 1 according to the related art.

FIG. 10 shows a gas flow sequence where only gas purging is used in each purge step without subdividing the step of supplying a reactant gas as is in the gas flow sequence in FIG. 2 illustrated in Japanese Laid-open Patent Publication No. 2004-23043.

(1) First, on stopping $N_2$ supply from each gas injector, TMA was supplied for 30 sec from a TMA gas injector while keeping a pressure at 80 Pa.

(2) Next, on stopping TMA supply, $N_2$ was supplied from each gas injector and the chamber was gas-purged for 40 sec while keeping a pressure at 200 Pa (1.5 Torr) by the pressure-regulating valve 107.

(3) Then, on stopping $N_2$ supply from each gas injector, $O_3$ was supplied for 30 sec from an $O_3$ gas injector while keeping a pressure at 200 Pa.

(4) Then, on stopping $O_3$ supply, $N_2$ was supplied from each gas injector and the chamber was gas-purged for 40 sec while keeping a pressure at 80 Pa by the pressure-regulating valve 107.

Evaluation

There will be described the results of property comparison of dielectric bodies for a DRAM capacitor formed in Example 2 according to this invention and Comparative Example 1.

FIG. 11(a) shows a cross-sectional structure of a test sample used in the property evaluation. In this test sample, an interlayer insulating film 214 with a thickness of 300 nm is formed on an n-type semiconductor substrate 201 and in a given region, a capacitance-contact plug 215 of an n-type polycrystalline silicon is formed. Furthermore, an interlayer insulating film 217 with a thickness of 3,000 nm is formed over the whole surface and a hole 218 is formed such that the capacitance-contact plug 215 is exposed. A lower electrode comprising HSGs 200 is formed inside of the hole 218. A dielectric body 220 of an aluminum oxide film with a thickness of 4 nm and an upper electrode 221 of titanium nitride are formed inside of the hole 218 and on the interlayer insulating film 217.

Figure 4:
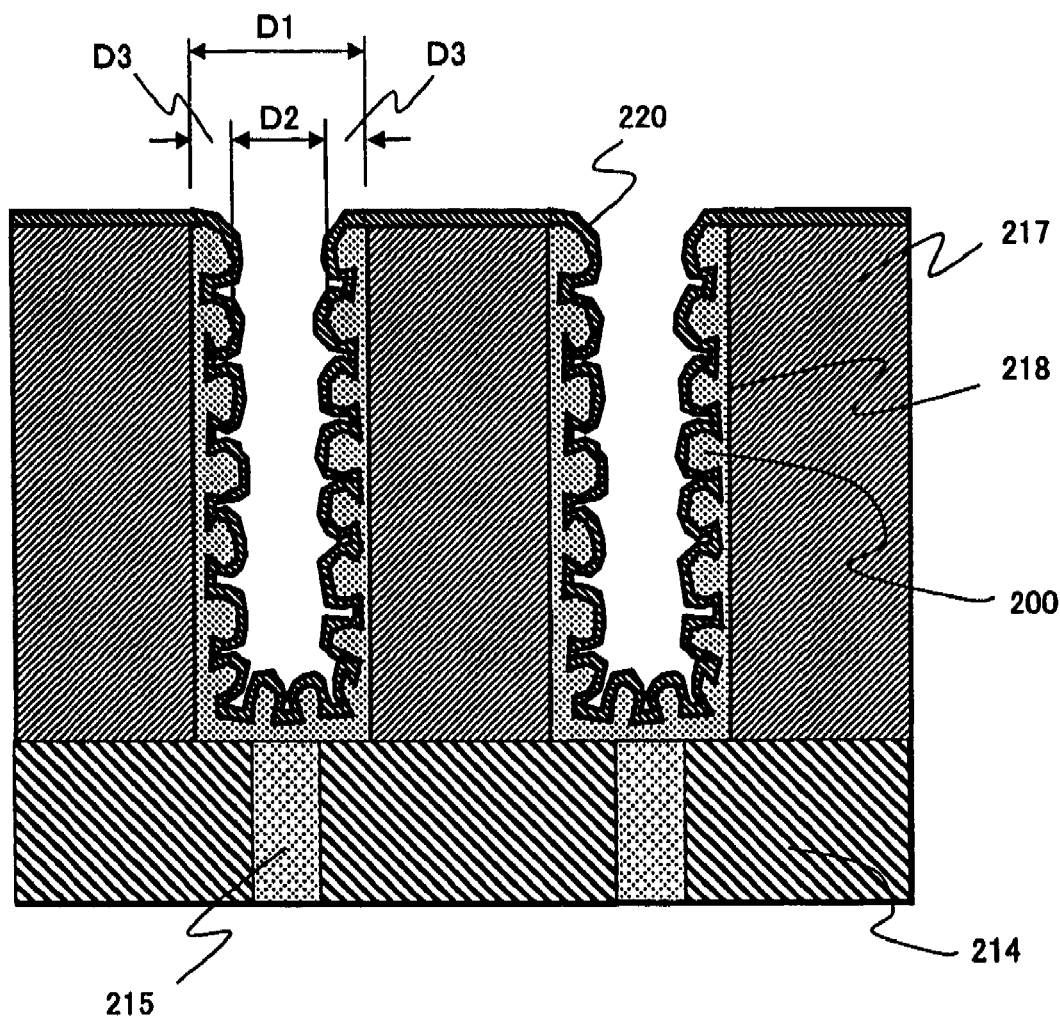
FIG. 4 is a schematic enlarged cross-sectional view of the capacitor in FIG. 3.

The above DRAMs formed by the processes in Example 2 and Comparative Example 1 were evaluated for reliability in a leak current and dielectric breakdown when applying a positive and a negative voltages to the upper electrode 221 regarding the semiconductor substrate as a ground potential. Here, a plurality of samples having different hole diameters D1 shown in FIG. 4 were simultaneously formed and a height D3 of HSGs 200 was controlled to be constant of 80 nm. One test sample comprises ten holes 218 (corresponding to a 10 bit memory cell in a DRAM) and 10 capacitors were simultaneously evaluated in parallel.

FIG. 11(b) shows the results of comparing leak current properties of dielectric bodies formed in Example 2 and Comparative Example 1, and comparison is made for the representative results for a sample having the highest leak current among a plurality of evaluation samples. In FIG. 11(b), a horizontal axis represents a voltage applied to the upper electrode and a vertical axis represents a leak current value per one capacitor (cell). In terms of this leak current, evaluation criterion for mounting in a product is that a leak current is 1E-17 (A/cell) or less at a voltage of ±1 V.

The results in FIG. 11(b) indicate that the DRAM in Example 2 employing two-stage purging of vacuum purging and gas purging and dividing the step of supplying $O_3$ as a reactant gas into substeps, gives an adequately low leak current at ±1 V to meet the evaluation criterion. On the other hand, the results indicate that the DRAM in Comparative Example 1 conducting only gas purging gives a leak current of 5E-15 (A/cell) at ±1 V, which does not meet the evaluation criterion.

Figure 12:
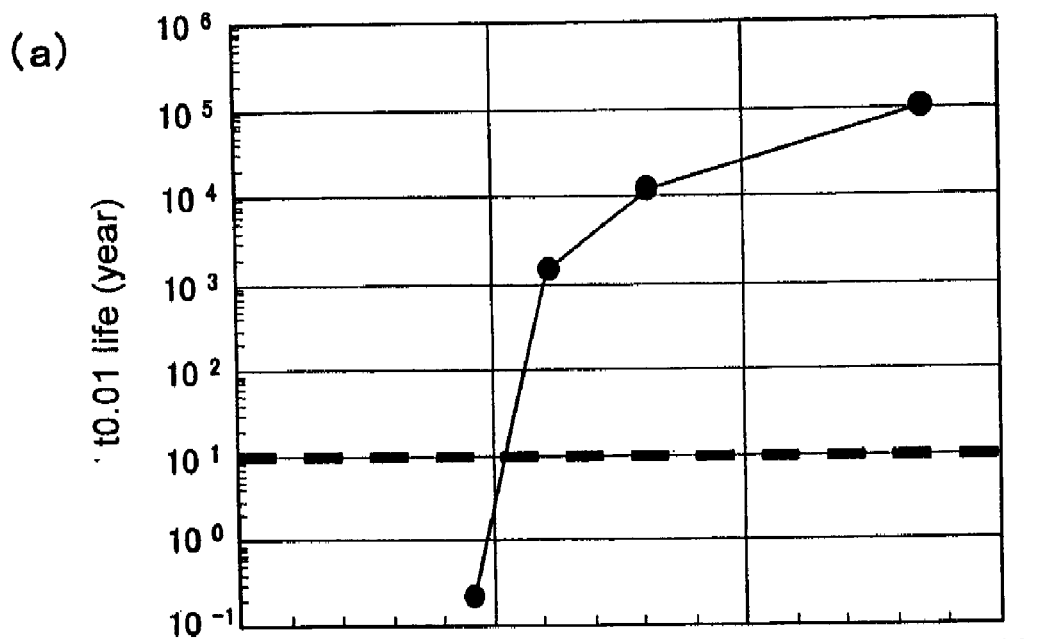
FIG. 12 shows the results of reliability evaluation in accordance with a TDDB method.
Figure 12:
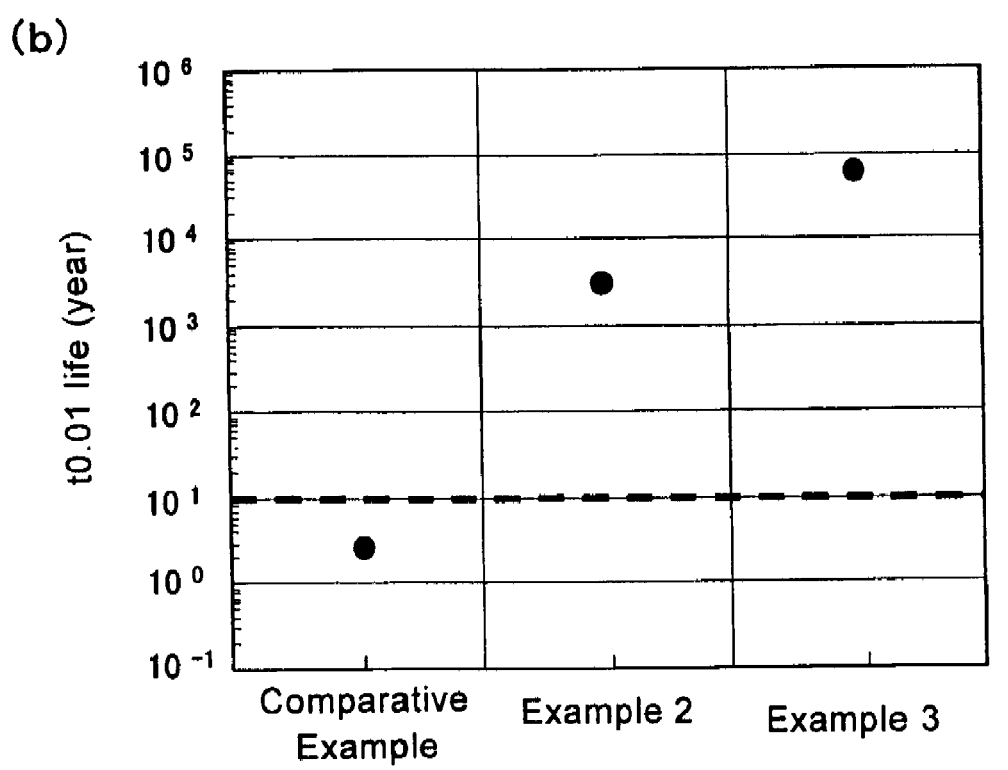

FIG. 12 shows the evaluation results of a t0.01 life for the DRAMs in Examples 1 and 2 and Comparative Example 1 (a time (year) taken for cell breaking of 0.01% of memory cells in 256 Mbit DRAM) measured using a known TDDB (Time Dependent of Dielectric Breakdown) method. Generally, for a semiconductor device, a t0.01 life of 10 years (the level indicated by the dotted line in this figure) or more is one criterion for product reliability assurance.

Figure 11:
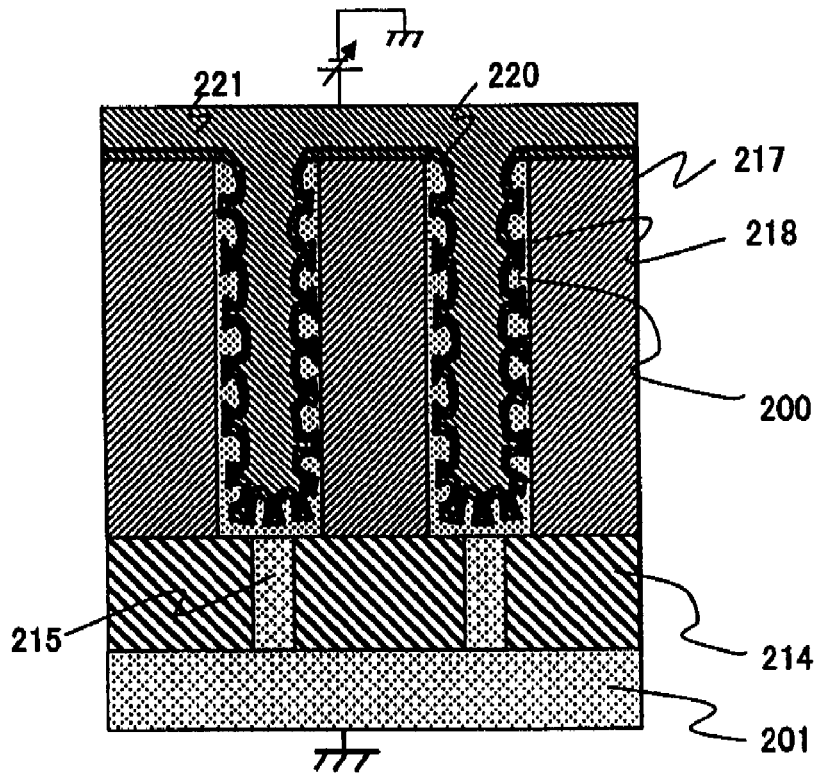
FIG. 11(*a*) is a schematic cross-sectional view of a test sample illustrating a sample for evaluating properties.
Figure 11:
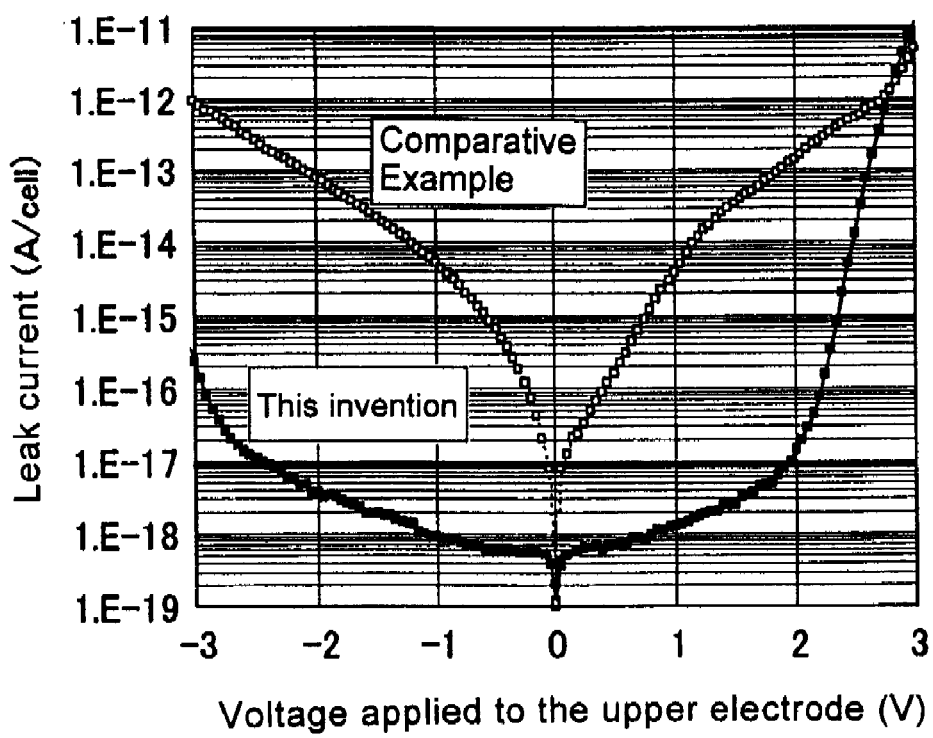

FIG. 12(a) shows the evaluation results of a t0.01 life when varying a diameter of the hole 218 in a test sample shown in FIG. 11 and obtained using the process in Comparative Example 1. The results in FIG. 12(a) indicate that using the process in Comparative Example 1, adequate reliability can be ensured for a diameter of the hole 218 in the range of 220 nm or more, but reliability cannot be ensured for a diameter of 190 nm. That is, the results indicate that the process of Comparative Example 1 conducting only gas purging cannot form a dielectric body reliable to the bottom of a deep hole with a reduced diameter. The results also indicate that the process cannot be applied to a further finer high-capacity DRAM of 512 Mbit or more.

FIG. 12(b) shows the evaluation results of a t0.01 life for the dielectric bodies formed in Comparative Example 1 and Examples 1 and 2, with the hole 218 in a test sample being constant, 200 nm. The results indicate that while Comparative Example 1 does not meet the criterion of a t0.01 life of 10 years, the processes in Examples 1 and 2 can sufficiently ensure the criterion of a t0.01 life of 10 years or more. That is, the results demonstrate that a dielectric body highly reliable to the bottom of a deep hole can be formed according to the present invention employing a two-stage purging comprising vacuum purging and gas purging and dividing the step of supplying $O_3$ as a reactant gas into substeps.

Although the present invention has been described in detail mainly for exemplary semiconductor devices comprising an aluminum oxide film, the present invention is not limited to these specific examples, and can be used for forming, in addition to the hafnium oxide film described in Example 4, a zirconium oxide film, a tantalum oxide film, a strontium oxide film, a titanium oxide film or the like.

For example, a metal source for forming a zirconium oxide film can be tetraethylmethylamidezirconium (TEMAZr: $Zr(N(CH_3)(C_2H_5))_4$). For a tantalum oxide film, pentaethoxytantalum (PET: $Ta(OC_2H_5)_5$) can be used. For a strontium oxide film, bis(methoxyethoxytetramethylheptanedionate) strontium $(Sr(METHD)_2)$ can be used. Furthermore, for a titanium oxide film, tetradimethylamidetitanium (TDMATi: $Ti(N(CH_3)_2)_4$) can be used as a metal source gas.

Although there have been described examples of forming a metal oxide using an oxidizing gas as a reactant gas, the present invention is not limited to these examples, and a nitride dielectric body can be formed using a reducing gas such as ammonia ($NH_3$). For example, a metal nitride such as a tantalum nitride film, an aluminum nitride film and a hafnium nitride film can be formed by using an $NH_3$ supply source in place of an $H_2O$ supply source and using a metal source as a source gas. These metal nitrides and the above metal oxides can be appropriately combined as described in Example 4, to form a laminate film.

What is claimed is:

1. A process for manufacturing a semiconductor device where films are formed on a plurality of semiconductor substrates by ALD using a vertical batch processing machine, comprising at least depositing films on the plurality of semiconductor substrates by ALD by repeating twice or more a cycle of:
   (1) a first step of supplying a source gas into a reaction chamber at a lower pressure than an atmospheric pressure in the vertical batch processing machine in which the plurality of semiconductor substrates are disposed,
   (2) a second step of vacuum-purging the reaction chamber,
   (3) a third step of gas-purging the reaction chamber, and
   (4) a fourth step of supplying an oxide reactant gas into the reaction chamber, wherein the fourth step of supplying the reactant gas is divided into
   (4-1) a substep of supplying the oxide reactant gas into the reaction chamber,
   (4-2) a substep of vacuum-purging the reaction chamber, and
   (4-3) a substep of gas-purging the reaction chamber, wherein a cycle of substeps (4-1) to (4-3) is repeated once or more.

2. The process for manufacturing a semiconductor device as claimed in claim 1,
   wherein a plurality of holes with a depth of 2,000 to 3,500 nm are formed in the surfaces of the plurality of semiconductor substrates.

3. The process for manufacturing a semiconductor device as claimed in claim 1,
   wherein the source gas is a metal-containing gas, and the reactant gas is an oxidizing gas or reducing gas.

4. The process for manufacturing a semiconductor device as claimed in claim 1, further comprising, after the step (4),
   (5) a fifth step of vacuum-purging the reaction chamber, and
   (6) a sixth step of gas-purging the reaction chamber.

5. A process for manufacturing a semiconductor device where films are formed on a plurality of semiconductor substrates by ALD using a vertical batch processing machine, comprising at least
   (1) a first step of forming, in the plurality of semiconductor substrates comprising insulating films, a plurality of holes in the insulating films,
   (2) a second step of forming lower electrodes inside of the plurality of holes,
   (3) a third step of placing the plurality of semiconductor substrates with the lower electrodes within a reaction chamber of the vertical batch processing machine,
   (4) a fourth step of vacuuming the reaction chamber to a pressure lower than an atmospheric pressure and then supplying a metal source gas into the reaction chamber,
   (5) a fifth step of vacuum-purging the reaction chamber,
   (6) a sixth step of gas-purging the reaction chamber,
   (7) a seventh step of supplying an oxidizing gas into the reaction chamber,
   (8) an eighth step of repeating twice or more a cycle of the fourth to the seventh steps, to form dielectric bodies on the plurality of semiconductor substrates,
   (9) a ninth step of removing the plurality of semiconductor substrates from the reaction chamber, and
   (10) a tenth step of forming upper electrodes on the dielectric bodies,
   wherein the seventh step of supplying the oxidizing gas is divided into
   (7-1) a substep of supplying the oxidizing gas into the reaction chamber,
   (7-2) a substep of vacuum-purging the reaction chamber,
   (7-3) a substep of gas-purging the reaction chamber,
   wherein a cycle of substeps (7-1) to (7-3) is repeated twice or more.

6. The process for manufacturing a semiconductor device as claimed in claim 5,
   wherein a depth of the holes formed in the first step is 2,000 to 3,500 nm.

7. The process for manufacturing a semiconductor device as claimed in claim 5,
   wherein the metal source gas contains at least one metal selected from the group consisting of aluminum (Al), hafnium (Hf), tantalum (Ta), zirconium (Zr), strontium (Sr) and titanium (Ti), and
   the oxidizing gas contains at least one of ozone ($O_3$) and steam ($H_2O$).

8. The process for manufacturing a semiconductor device as claimed in claim 5,
   wherein the dielectric bodies are multilayer films of single metal-oxide films or of different metal-oxide films.

9. The process for manufacturing a semiconductor device as claimed in claim 5, further comprising, between the steps (7) and (9),
   (11) an eleventh step of vacuum-purging the reaction chamber and
   (12) a twelfth step of gas-purging the reaction chamber and the eighth step in the step (8) is a step of forming dielectric bodies on the plurality of semiconductor substrates by repeating twice or more a cycle of the fourth to the seventh steps and the eleventh to the twelfth steps.

* * * * *